United States Patent [19]
Koo

[11] 3,976,895
[45] Aug. 24, 1976

[54] LOW POWER DETECTOR CIRCUIT

[75] Inventor: James Teh-Zen Koo, Sunnyvale, Calif.

[73] Assignee: Bell Telephone Laboratories, Incorporated, Murray Hill, N.J.

[22] Filed: Mar. 18, 1975

[21] Appl. No.: 559,543

[52] U.S. Cl. .............................. 307/235 F; 307/279; 307/DIG. 3
[51] Int. Cl.² ...................... H03K 5/18; H03K 5/20; H03K 3/286; H03K 3/353
[58] Field of Search ............ 307/235 R, 235 F, 238, 307/279, DIG. 3

[56] References Cited
UNITED STATES PATENTS

| 3,774,176 | 11/1973 | Stein et al. | 307/279 X |
| 3,838,295 | 9/1974 | Lindell | 307/304 X |
| 3,849,673 | 11/1974 | Koo | 307/279 X |
| 3,868,656 | 2/1975 | Stein et al. | 307/279 X |
| 3,876,887 | 4/1975 | Reed | 307/304 X |
| 3,879,621 | 4/1975 | Cavaliere et al. | 307/205 X |
| 3,892,984 | 7/1975 | Stein | 307/279 |

OTHER PUBLICATIONS

Hunter, *Handbook of Semiconductor Electronics;* McGraw–Hill Book Co.; pp. 11–37 to 11–38; 1970 (3rd Edition).

Primary Examiner—John S. Heyman
Assistant Examiner—Larry N. Anagnos
Attorney, Agent, or Firm—I. Ostroff

[57] ABSTRACT

A low power detector circuit consists of the basic four MOS transistors of an MOS flip-flop and includes another pair of MOS transistors as well as voltage equalization circuitry. The added pair of transistors and the cross coupling of the gates of two of the other transistors results in a detector circuit which automatically limits power dissipation at least by the time the proper output signal levels are attained.

8 Claims, 1 Drawing Figure

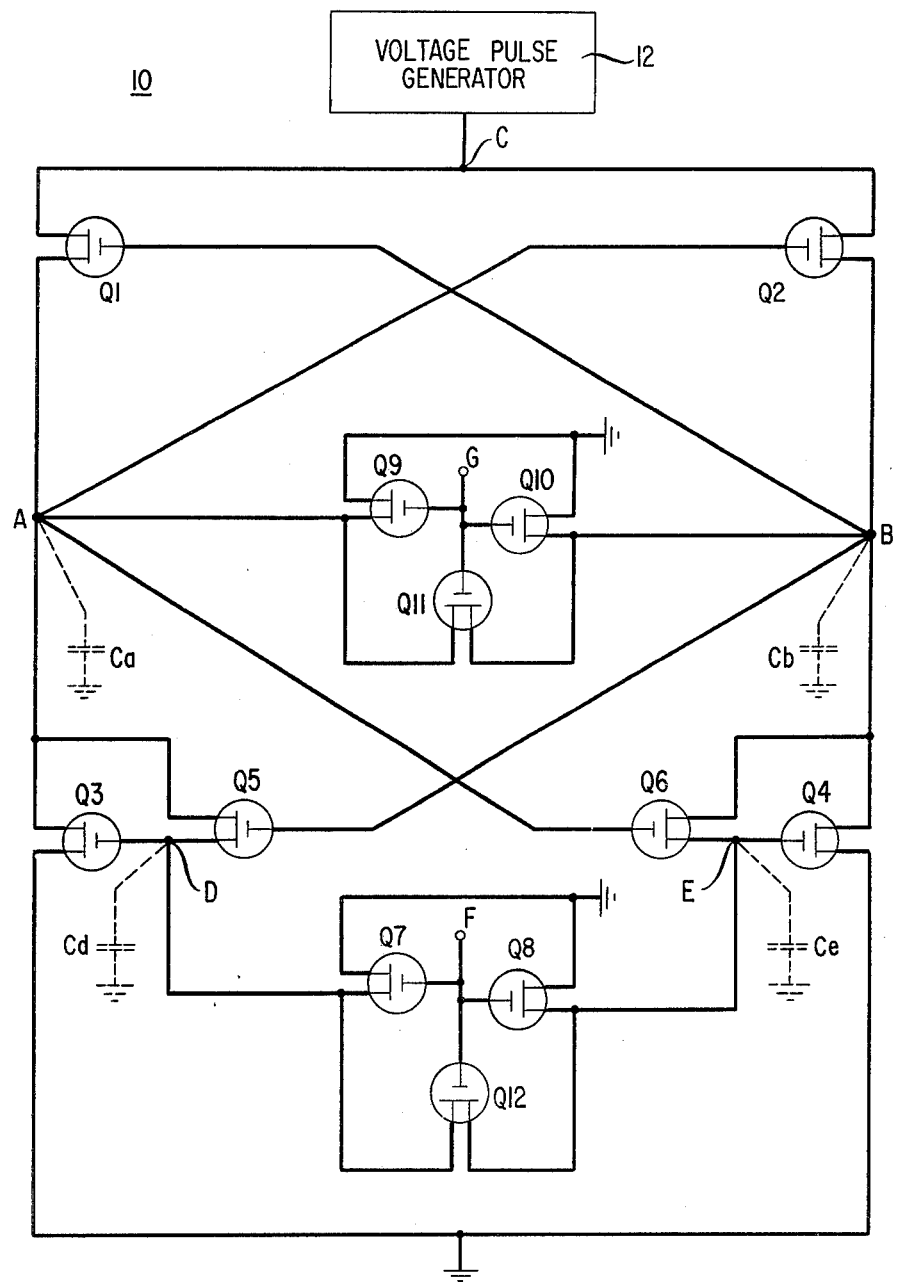

LOW POWER DETECTOR CIRCUIT

BACKGROUND OF THE INVENTION

This invention relates to detector circuits and in particular to MOS dectector circuits used in conjunction with dynamic memory systems.

One basic detector is essentially a flip-flop circuit in which current alternates from one leg to the other as a function of an input signal. Each leg contains an MOS load transistor in series with an MOS switching transistor. The gate of each switching transistor is cross-coupled to the drain of the other switching transistor. A DC voltage supply is applied to the common drains of the load transistors and an input signal is coupled to one of the gates of the switching transistors. One of the major problems of this detector is that power dissipation is relatively high since there is essentially always a flow of DC current.

The use of the basic MOS detector flip-flop with a pulsed voltage power supply reduces power dissipation. Ideally power should be turned off just after the proper output state is achieved. One difficulty is that a reasonable time span must be provided after the output is supposed to have reached the correct level in order to insure that in fact the correct level is achieved.

A detector circuit which automatically limits power dissipation at the time that the output signals reach the appropriate levels would be desirable.

SUMMARY OF THE INVENTION

An illustrative embodiment of the invention comprises a detector circuit which has essentially six interconnected switching devices (Q1–Q6) that are typically MOS transistors. Q1 and Q2 have the sources thereof coupled together. The gates of Q1 and Q2, which serve as input/output terminals, are cross-coupled to the drains of Q2 and Q1, respectively. q3 is serially coupled by the source to the drain of Q1. Q4 is serially coupled by the source to the drain of Q2. Q5 has the source, drain and gate thereof coupled to the source and gate of Q3, and to the source of Q4, respectively. The source, drain and gate of Q6 are coupled to the source and gate of Q4 and the source of Q3, respectively. The sources of Q1 and Q2 are coupled to a voltage pulse generator and the drains of Q3 and Q4 are coupled to a reference potential. First voltage equalization circuitry is coupled to the input/output terminals. Second voltage equalization circuitry is coupled to the gates of Q3 and Q4.

In operation the above circuit acts as a detector as follows: At the start of a cycle the voltage pulse generator is at the reference potential and consequently there is essentially no steady-state current flow. The gates of Q1, Q2, Q3 and Q4 are essentially equalized in potential by the first and second equalization circuitry, and then allowed to float at that potential.

An input signal is then applied to either input/output terminal. This signal causes one of the input/output terminals to become more positive in potential than the other. Now the voltage pulse generator potential is increased such that conduction begins through Q1 and Q2.

The input/output terminals rapidly increase in potential because of the coupling of the circuit transistors. The initial inbalance is rapidly increased and, as a consequence, the final output signal levels are rapidly attained. By the time the proper output signal levels are reached, Q1 and Q4 or Q2 and Q3 are turned off. Consequently any possible DC conduction ceases. Thus, as the output signals reach the proper levels, power dissipation is essentially cut off. The output signal levels are now sensed. The voltage pulse generator potential is then returned to the reference level and a new cycle can start.

These and other features of the invention will be better understood from a consideration of the following detailed description taken in conjunction with the following detailed description taken in conjunction with the following drawings:

BRIEF DESCRIPTION OF THE DRAWINGS

The FIGURE illustrates in circuit schematic form an illustrative embodiment of the invention.

DETAILED DESCRIPTION

Referring now to the FIGURE, there is illustrated a detector circuit 10 which comprises 12 transistors, Q1, Q2, Q3, Q4, Q5, Q6, Q7, Q8, Q9, Q10, Q11 and Q12. For illustrative purposes, the transistors are shown as p-type MOS transistors. An MOS transistor will be described as enabled if the potential of the gate with respect to the source is of sufficient magnitude and polarity to allow conduction between the source and drain thereof for the applied source-drain potential. Conversely, a disabled MOS transistor is one in which the potential of the gate is insufficient to allow conduction between the source and drain.

The sources of Q1 and Q2 are connected together at node C and are coupled to voltage pulse generator 12. Voltage pulse generator 12 provides a high positive voltage (typically +16 volts) or a reference level (typically ground potential). The drain of Q1 is coupled to node A, corresponding to the sources of Q3 and Q5, the gates of Q2 and Q6, and the source of Q9. The drain of Q2 is coupled to node B, corresponding to the sources of Q4 and Q6, the gates of Q1 and Q5, and the source of Q10.

The drain of Q5 is coupled to node D, corresponding to the gate of Q3 and the source of Q7. The drain of Q6 is coupled to node E, corresponding to the gate of Q4, and the source of Q8. The gates of Q7 and Q8 are coupled together to node F. The gates of Q9 and Q10 are coupled together to node G. The drains of Q3, Q4, Q7, Q8, Q9 and Q10 are all coupled to a reference voltage supply (typically ground potential).

The gate, drain and source of Q11 are coupled to node G, the source of Q9 and the source of Q10, respectively. The gate, drain and source of Q12 are coupled to node F, the source of Q7 and the source of Q8, respectively. Q9, Q10 and Q11 serve basically to selectively equalize the potentials of nodes A and B. Q7, Q8 and Q12 serve basically to selectively equalize the potentials of nodes D and E.

Node A and node B serve as first and second input/output terminals and provide complementary output signals. The dashed-line capacitances Ca, Cb, Cd and Ce represent the parasitic capacitances associated with nodes A, B, D and E, respectively.

Circuit 10 operates as follows: Initially, the potential applied by voltage pulse generator 12 to node C is at a reference potential (typically ground potential) and nodes F and G are held at a relatively high positive voltage level (typically +16 volts). At this point in time Q7, Q8, Q9, Q10, Q11 and Q12 are disabled and nodes A and B are essentially disconnected from any input signals and are floating in potential. These conditions insure that initially there is essentially no DC current flow through any of the transistors of circuit 10.

The potentials of nodes G and F are now pulsed to ground potential and then returned to +16 volts. This enables Q7, Q8, Q9, Q10, Q11 and Q12 and thus sets nodes A, B, D and E to approximately one threshold voltage above ground potential. The returning of nodes G and F to +16 volts disables Q7, Q8, Q9, Q10, Q11 and Q12. Nodes A, B, D and E are left floating in potential at the set value.

In the preferred embodiment Q7, Q8, Q9, and Q10 all have essentially the same threshold voltage since they all have essentially the same geometry and are fabricated together on a single monolithic integrated circuit chip. Any differences in the threshold voltages of Q9 and Q10 cause nodes A and B to be set to different potential levels. Q11 serves to insure that nodes A and B are set to essentially the same potential by directly connecting nodes A and B when Q11 is enabled. Thus, even slight differences in threshold voltages of Q9 and Q10 are effectively cancelled because Q11 insures that nodes A and B are equalized in potential. Q11 increases the sensitivity of circuit 10 by allowing input signals to be somewhat smaller in magnitude than is the case if Q11 is not utilized. Q12 serves the same basic funtion with respect to nodes D and E as Q11 serves with respect to nodes A and B. In many applications Q11 and Q12 can be eliminated.

At this point in time assume a 1 level input signal is applied to node A and no input signal is applied to node B. This input signal, which is typically the discharge current from a dynamic memory cell, causes the potential of node A to become more positive than that of node B. After the input signal is applied and the potential of node A charges in response thereto, the potential of node C is increased from ground potential to typically +16 volts.

Q1 and Q2 are now enabled and therefore current flow begins from node C through Q1 and Q2. This conduction charges nodes A and B towards +16 volts (the potential of node C at this point in time). The gate-to-source voltage of Q1 is higher than that of Q2 because node B is initially at a lower potential than node A. As a result Q1 conducts more heavily than Q2. This causes node A to reach a sufficiently positive value to disable Q2 before the potential of node B can reach a sufficiently positive value to disable Q1. The electrical path which existed between nodes C and B is now opened and node B can no longer increase in potential. This condition maintains Q1 enabled and therefore, node A continues charging towards +16 volts.

Q6, which has the gate thereof coupled to node A, is disabled since the gate thereof is at a higher potential than the source which is coupled to node B. Thus, node E (the gate of Q4) continues to float in potential at the initially set value of approximately one threshold voltage above ground potential. If node B reaches a value greater than two threshold voltages above ground potential before Q2 is disabled, Q4, which will be enabled, conducts until node B is pulled down in potential to two threshold voltages above ground potential. A potential level of +two threshold voltages above ground potential or less is defined as a 0 output signal.

The gate of Q5, which is connected to node B, is thus set to a potential of no more than +two threshold voltages above ground potential. Q3 is enabled and conducts as node A increases in potential to two threshold voltages above ground potential. As node A continues to become more positive, Q5 is enabled and conducts such that node A is essentially directly connected to node D. The relatively high potential of node A is thus applied to node D. As a result Q3 becomes disabled and possible conduction from node C through Q1 and Q3 to ground potential ceases. Node A continues to charge toward the potential of node C (+16 volts) because Q1 is still enabled. As the potential of node A reaches essentially the same potential as node C (approximately +16 volts) conduction through Q1 ceases. This potential at node A is defined as a 1 output signal level.

The output voltage levels of nodes A and B are now sensed and then node C is returned to ground potential. This is the end of the cycle and a new cycle can now start. It is not necessary to return node C to ground potential in order to limit power dissipation, since at least by the time the appropriate output signal levels are reached, circuit 10 has automatically opened an DC paths between node C and ground potential.

If an input signal 0 is applied to node A instead of a 1, then node B becomes more positive than node A. As node C is pulsed to +16 volts, node B rapidly becomes even more positive than node A until Q1 becomes disabled. Q2 is maintained enabled and thus node B charges up to essentially +16 volts. Node A is held at +two threshold voltages above ground potential. This causes Q6 to be enabled and consequently for node E (the gate of Q4), to be set to approximately the potential of node B. This condition disables Q4 and thus opens any possible DC path between node C and ground potential which may have existed through Q2 and Q4. Since Q1 is also disabled, no DC path exists between node C and ground potential through Q1 and Q3. Thus all possible DC paths between node C and ground potential are eliminated.

The reaching of the appropriate output levels at the A or B terminals automatically eliminates DC current flow through circuit 10 by opening up all DC paths that can exist between the voltage pulse generator 12 and ground potential. This serves to limit power dissipation. Terminal A or B is able to rapidly charge to the 1 level because Q3 or Q4 turns off relatively rapidly and thereby isolates terminal A or B from the ground potential coupled to the drains of Q3 and Q4. The output node at the 1 level can deliver current to any circuits attached thereto as long as the voltage pulse generator 12 is held at +16 volts. The other output terminal, which is at the 0 level, can serve as a sink for current from any circuitry coupled thereto. The output signal levels at nodes A and B are substantially maintained while node C is held up at +16 volts and there is essentially no power dissipation at this time since no DC paths exist between node C and ground potential.

It is to be understood that the embodiments described are merely illustrative of the general principles of the invention. Various modifications are possible within the spirit of the invention. For example, n-channel transistors could be substituted for the p-channel transistors providing the polarities of power supply potentials are appropriately reversed. Differences in the parameters of Q1 and Q2 tend to limit the sensitivity of the present detector circuit. The teachings of U.S. Pat. No. 3,849,673, in which there is the same inventor and assignee, can be applied to this present invention to increase the sensitivity of the detector.

What is claimed is:

1. A detector circuit comprising:

first, second, third, fourth, fifth and sixth switching devices, each device having a control terminal and first and second terminals;

the first terminals of the first and second devices being coupled together and being adapted to be coupled to pulse supply means;

the second terminals of the first and second devices being adapted to serve as input/output terminals and being coupled to the first terminals of the third and fourth devices, respectively;

the control terminal of the first device being coupled to the second terminal of the second device and the control terminal of the second device being coupled to the second terminal of the first device;

the second terminals of the third and fourth switching devices being adapted to be coupled to first power supply means;

the first, second and control terminals of the fifth device being coupled to the first terminal of the third device, the control terminal of the third device, and the first terminal of the fourth device, respectively; and the first, second and control terminals of the sixth device being coupled to the first terminal of the fourth device, the control terminal of the fourth device, and the first terminal of the third device, respectively.

2. The apparatus of claim 1 wherein the switching devices are all MOS transistors.

3. The apparatus of claim 1 further comprising;

first voltage equalization circuit means coupled to the control terminals of the third and fourth devices for selectively essentially equalizing the potentials of the control terminals of the third and fourth devices; and second voltage equalization circuit means coupled to the second terminals of the first second devices for selectively essentially equalizing the potentials of the second terminals of the first and second devices.

4. The apparatus of claim 3 wherein:

the first voltage equalization circuit means comprises seventh and eighth switching devices, each device having a control terminal and first and second terminals;

the control terminals of the seventh and eighth devices being coupled together;

the second terminals of the seventh and eighth devices being coupled to the control terminals of the third and fourth devices, respectively;

the first terminals of the seventh and eighth switching devices being adapted to be coupled to second power supply means;

the second voltage equalization circuit means comprises ninth and tenth switching devices, each device having a control terminal and first and second terminals;

the first terminals of the ninth and tenth switching devices being adapted to be coupled to third power supply means;

the control terminals of the ninth and tenth devices being coupled together; and the second terminals of the ninth and tenth devices being coupled to the second terminals of the first and second devices, respectively.

5. The apparatus of claim 4 wherein:

the first voltage equalization circuit means further comprises a twelfth switching device which has a control terminal and first and second terminals;

the control terminal of the twelfth device being coupled to the control terminals of the seventh and eighth devices;

the first terminal of the twelfth device being coupled to the second terminal of the seventh device;

the second terminal of the twelfth device being coupled to the second terminal of the eighth device;

the second voltage equalization circuit means further comprises an eleventh switching device which has a control terminal and first and second terminals;

the control terminal of the eleventh device being coupled to the control terminals of the ninth and tenth devices; and the first terminal of the eleventh device being coupled to the second terminal of the ninth device; and the second terminal of the eleventh device being coupled to the second terminal of the tenth device.

6. The apparatus of claim 5 wherein the second terminals of the third, fourth, seventh, eighth, ninth and tenth devices are all coupled together.

7. The apparatus of claim 6 wherein the switching devices are all MOS transistors.

8. A detector circuit comprising:

pulse supply means and power supply means;

first, second, third, fourth, fifth and sixth switching devices, each device having a control terminal and first and second terminals;

the first terminals of the first and second devices being coupled together and being coupled to the pulse supply means;

the second terminals of the first and second devices serving as input/output terminals and being coupled to the first terminals the third and fourth devices, respectively;

the control terminal of the first device being coupled to the second terminal of the second device and the control terminal of the second device being coupled to the second terminal of the first device;

the second terminals of the third and fourth switching devices being coupled to the power supply means;

the first, second and control terminals of the fifth device being coupled to the first terminal of the third device, the control terminal of the third device, and the first terminal of the fourth device, respectively;

the first, second and control terminals of the sixth device being coupled to the first terminal of the fourth device, the control terminal of the fourth device, and the first terminal of the third device, respectively;

first voltage equalization circuit means coupled to the control terminals of the third and fourth devices for selectively essentially equalizing the potentials of the control terminals of the third and fourth devices; and second voltage equalization circuit means coupled to the second terminals of the first and second devices for selectively essentially equalizing the potentials of the second terminals of the first and second devices.

* * * * *